United States Patent [19]
Beasom

[11] Patent Number: 5,466,963
[45] Date of Patent: Nov. 14, 1995

[54] TRENCH RESISTOR ARCHITECTURE

[75] Inventor: James D. Beasom, Melbourne Village, Fla.

[73] Assignee: Harris Corporation, Melbourne, Fla.

[21] Appl. No.: 180,737

[22] Filed: Jan. 13, 1994

[51] Int. Cl.⁶ .............................. H01L 27/12; H01L 27/02
[52] U.S. Cl. .......................... 257/516; 257/520; 257/538
[58] Field of Search ..................................... 257/536, 537, 257/538, 539, 540, 516, 542, 543; 338/22 SD

[56] References Cited

U.S. PATENT DOCUMENTS

| | | | |
|---|---|---|---|
| 3,484,932 | 12/1969 | Cook | 257/542 |
| 3,507,036 | 4/1970 | Antipov et al. | 257/542 |
| 3,585,714 | 6/1971 | Li | 257/516 |
| 3,601,669 | 8/1971 | Merryman | 257/516 |
| 4,758,531 | 7/1988 | Beyer et al. | 437/90 |
| 4,946,800 | 8/1990 | Li | 437/65 |
| 5,352,923 | 10/1994 | Boyd et al. | 257/536 |

FOREIGN PATENT DOCUMENTS 58-16559  1/1983  Japan ..................................... 257/543

Primary Examiner—Jerome Jackson
Assistant Examiner—Donald L. Monin, Jr.
Attorney, Agent, or Firm—Charles E. Wands

[57] ABSTRACT

Dielectrically isolated trench fill material is used for the formation of one or more isolated resistor elements within respective ones of a plurality of dielectrically isolated island components in which circuit devices are formed, or in adjacent substrate material. A respective island may have a plurality of trench strip resistor devices, which may have the same or differing resistor values depending upon their geometries or doping concentrations. In addition, the resistor-containing architecture may include one or more conductive cross-unders each defined by a respective cross-under trench strip. A cross-under trench strip contains conductive material, such as heavily doped polysilicon, as opposed to lightly doped polysilicon of the resistor fill material.

24 Claims, 5 Drawing Sheets

TRENCH RESISTOR ARCHITECTURE

FIELD OF THE INVENTION

The present invention relates in general to trench isolation integrated circuit architectures, and is particularly directed to a scheme for using dielectrically isolated trench material to form one or more isolated resistor elements within respective ones of a plurality of dielectrically isolated island components, or within the wafer proper.

BACKGROUND OF THE INVENTION

Trench isolation is a commonly employed scheme for achieving sidewall isolation in a variety of semiconductor architectures, such as silicon on insulator (SOI), including separation by implanted oxygen (SIMOX) and bonded wafer technologies, as well as PN junction isolation structures. Within the semiconductor wafer (e.g. silicon substrate), the trench is coated with an insulator material (typically oxide) and then filled with a material such as polysilicon, which is often electrically floating. Although a bias voltage may sometimes be applied to the poly-fill material in order to control parasitic sidewall MOS devices (for which the polysilicon fill acts as a gate), the essential function of the trench is to provide isolation among the islands of the substrate. Interconnect among circuit device regions has typically been accomplished by in situ diffusions within the islands and conductor tracks overlying a topside insulator layer.

In my U.S. Pat. No. 5,057,895, entitled: *"Trench Conductor and Crossunder Architecture,"* issued Oct. 15, 1991, and my U.S. Pat. No. 5,196,373, entitled: *"Method of Making Trench Conductor and Crossunder Architecture,"* issued Mar. 23, 1993, the disclosure of each of which is herein incorporated, I have described a new and improved dielectrically isolated trench semiconductor architecture and method of making that architecture, in which trench material (conductively doped polysilicon fill) is used as an interconnect structure for circuit devices that are supported within dielectrically isolated islands of a semiconductor substrate, thereby decreasing the amount of topside interconnect and thus reducing the potential for parasitics beneath tracks of surface metal.

Such a trench architecture may be employed to distribute one or more voltages to dielectrically-isolated islands of the substrate, by using a dielectric-coated trench grid pattern to subdivide the substrate into a plurality (e.g. matrix) of spaced-apart dielectrically isolated islands. Conductive material (e.g. doped polysilicon or polysilicon with a layer of resistivity-decreasing refractory material, such as a layer of tungsten) is formed in the dielectric-coated trench grid pattern and coupled to receive a prescribed voltage to be distributed throughout the substrate. Respective contact regions of islands that are to be electrically connected to a reference voltage are connected via local interconnects bridging oxide vias overlying the contact regions and adjacent locations in the trench grid pattern.

In addition to providing voltage distribution capability, the conductive fill material of a trench may be used to provide crossunders, i.e. interconnects that pass beneath and are electrically isolated from a surface conductor track, between regions of the same island or regions of separate islands. Respective contact regions of the island or islands are electrically interconnected to the conductive material in the trench via local interconnects bridging oxide vias overlying the contact regions and the adjacent locations in the trench.

The cross-under function may also be effected by providing one or more auxiliary dielectric-coated trench regions in at least one of the islands, such that a surface conductor overlies the surface of the one or more auxiliary trench regions in the one island between spaced apart locations of the island, the crossunder extending between the spaced apart island locations. Respective conductive layers provide electrical connections to these spaced-apart locations of the auxiliary trench regions and other portions of the circuit.

SUMMARY OF THE INVENTION

In accordance with the present invention, I have extended the use of dielectrically isolated trench fill material to circuit component applications, in particular to the formation of one or more isolated resistor elements within respective ones of a plurality of dielectrically isolated island components in which circuit devices are formed, or in the adjacent wafer itself. Pursuant to a first embodiment of the invention, a semiconductor substrate, such as a silicon-on-insulator structure, is subdivided by a trench pattern into a plurality of spaced-apart semiconductor islands, such that respective ones of the spaced-apart semiconductor islands are surrounded laterally by respective continuous trenches of the trench pattern, so that the spaced-apart semiconductor islands are electrically isolated from one another. The depth of the trench pattern typically extends through the island-containing substrate down to a bottom isolation region, which may be, for example, a P-type substrate for N-type islands, having an underlying insulator (oxide) layer, and the trench is coated with dielectric material, thereby effectively dielectrically isolating the respective islands from one another.

In order to provide a resistor element in a respective island, an additional or auxiliary 'trench strip' is formed in the island, which may be shallower than, but typically extends to the bottom of the depth of the trench pattern. Like the isolation trench, the trench strip has its bottom or floor portion, as well as its sidewalls, coated with dielectric material. The remaining portion of the trench strip is filled with resistive material, such as lightly doped polysilicon.

In order to define the geometry of the resistor, the trench strip has first and second spaced-apart resistor contact end portions, each of which has a first width. These two spaced-apart resistor contact end portions are connected by a reduced width resistive trench strip portion, which may be, but is not necessarily, narrower than the contact end portions. The 'narrowness' of a reduced width trench strip portion affects how large a resistance value is provided by the trench strip resistor.

A respective island may have one or a plurality of such resistor devices, each of which is defined by a respective trench strip. The individual resistor devices of a given island or differing islands or in the substrate proper, apart from the islands, may have the same of differing resistor values depending upon their geometries, particularly depth, length and width. For example a plurality of differently valued resistors may be formed by resistor trench strips of respectively different depths, each of which is less than the depth of the isolating trench pattern.

In addition, as in my above-referenced patents, the resistor-containing architecture according to the present invention may include one or more conductive cross-unders each defined by a respective cross-under trench strip. The cross-under trench strip contains conductive material (e.g. heavily doped polysilicon, as opposed to lightly doped polysilicon of the resistor fill material). Spaced-apart cross-under contacts ohmically contact the conductive material of the cross-under trench strip.

DETAILED DESCRIPTION

As pointed out briefly above, the present invention extends the use of dielectrically isolated trench fill material to circuit component applications, in particular to the formation of one or more isolated 'trench resistor' elements within respective ones of a plurality of dielectrically isolated island components in which circuit devices are formed, or in the substrate per se. Such trench resistors are especially useful as high valued high resistivity resistors. One advantage to the use of high resistivity trench fill material is derived from the fact that effective carrier mobility in polysilicon fill material is lower than in single crystalline silicon, so that a given level of doping in polysilicon will produce a high sheet resistivity (on the order of 4,000 ohms per square). Effects from the substrate or adjacent island bias, which can deplete or accumulate a trench resistor, are less for a given sheet resistivity, since a higher doping level must be used to achieve the same resistivity in polysilicon than in single crystal material. A change in bias induces a change in the number of carriers available for conduction through the trench, which is the same in polysilicon as in single crystal material. As a result the fraction of total carriers changed by bias is less in a polysilicon trench resistor.

Figure 1:
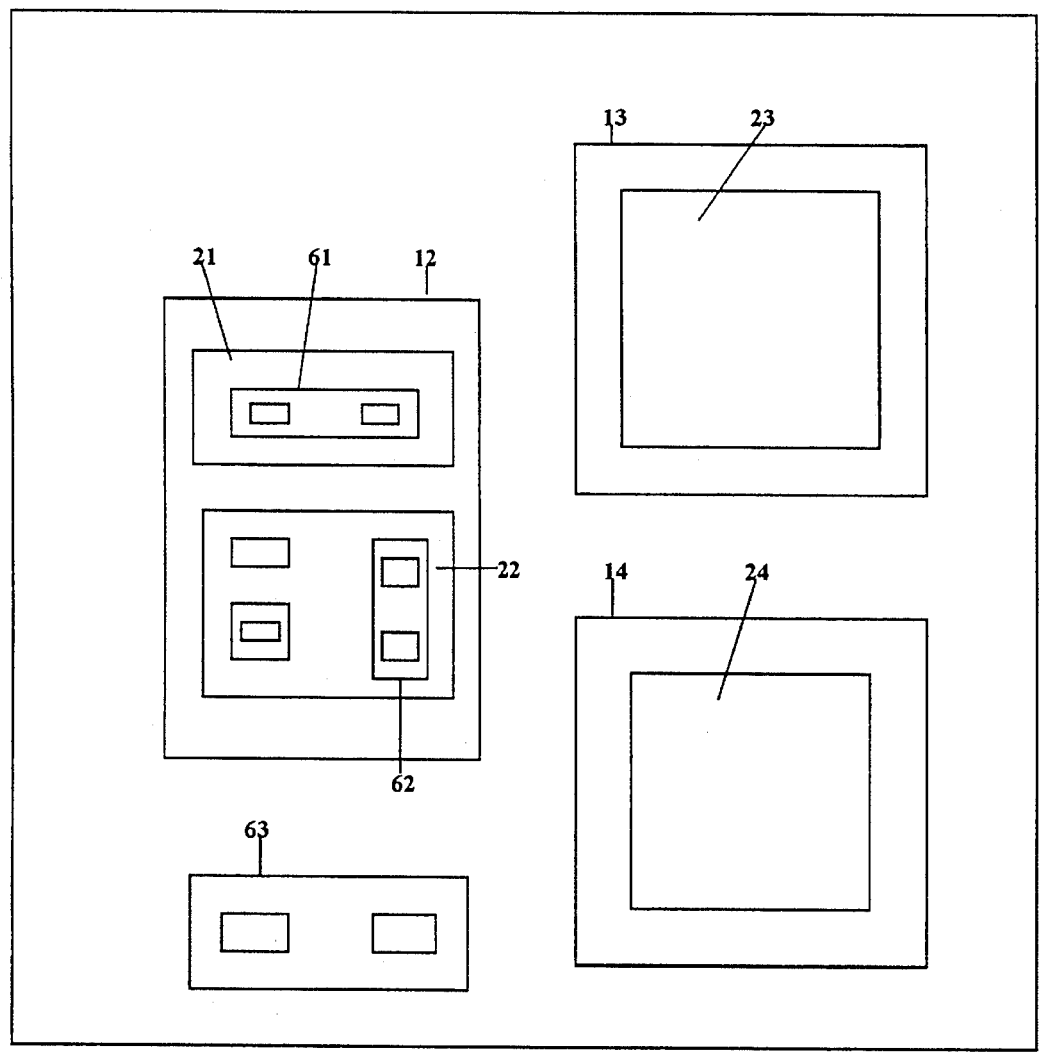
FIG. 1 shows a diagrammatic plan view of a first embodiment of the present invention comprising a semiconductor substrate which is subdivided by a pattern of isolation trenches into a plurality of spaced-apart semiconductor islands.
Figure 2:
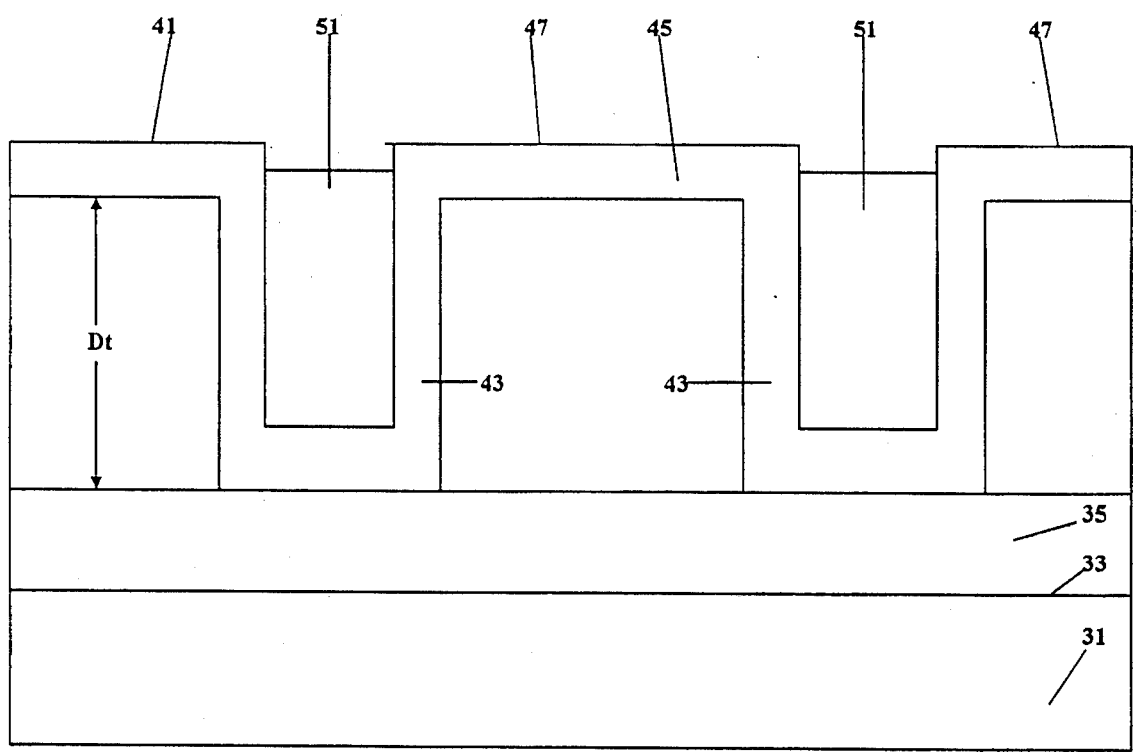
FIG. 2 diagrammatically shows a silicon-on-insulator architecture containing a trench pattern that extends to an underlying insulator layer, the trench being coated with dielectric material, thereby effectively dielectrically isolating respective islands from one another.
Figure 3:
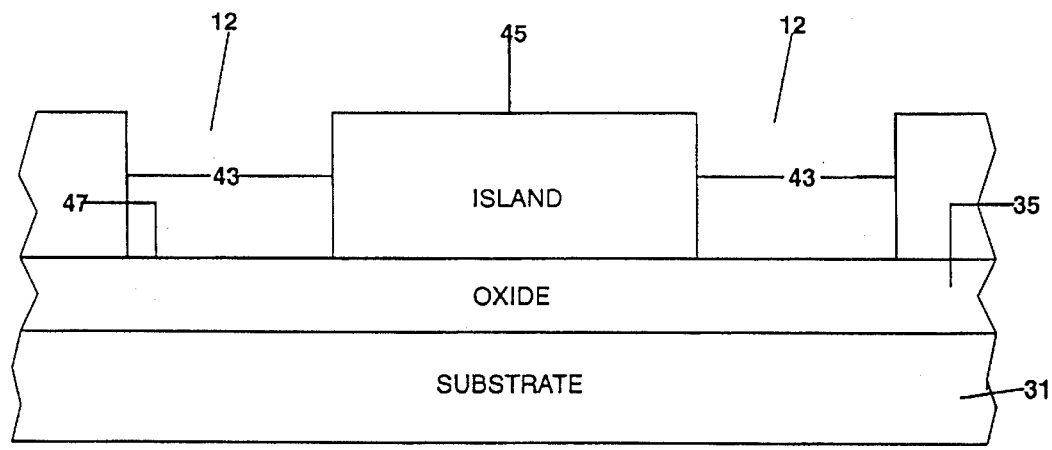
FIG. 3–5 illustrate process steps carried out in the course of the non-selective deposition of polysilicon and planarization of a semiconductor wafer to provide a dielectrically isolated structure.
Figure 4:
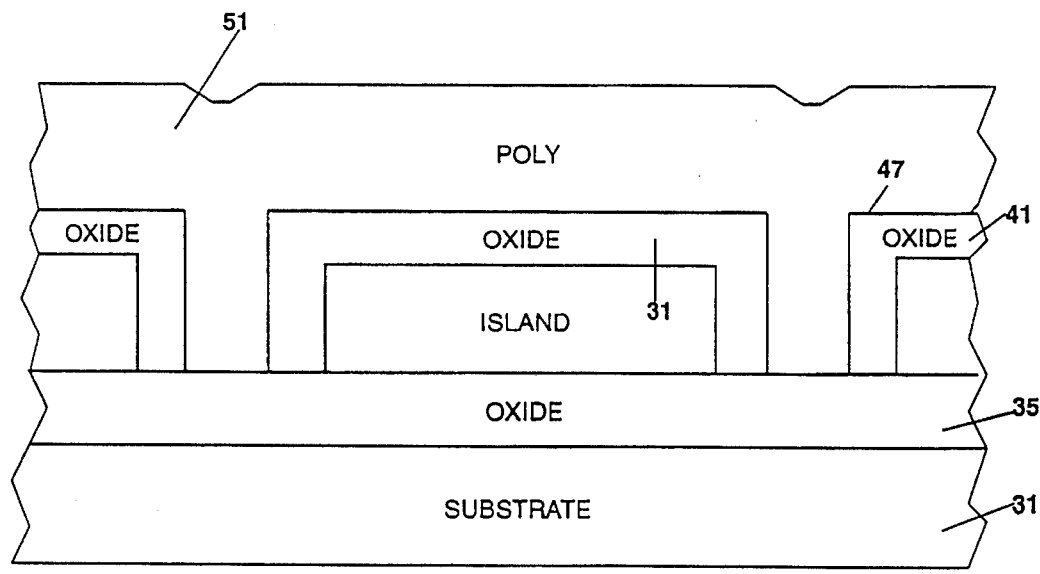
Figure 5:
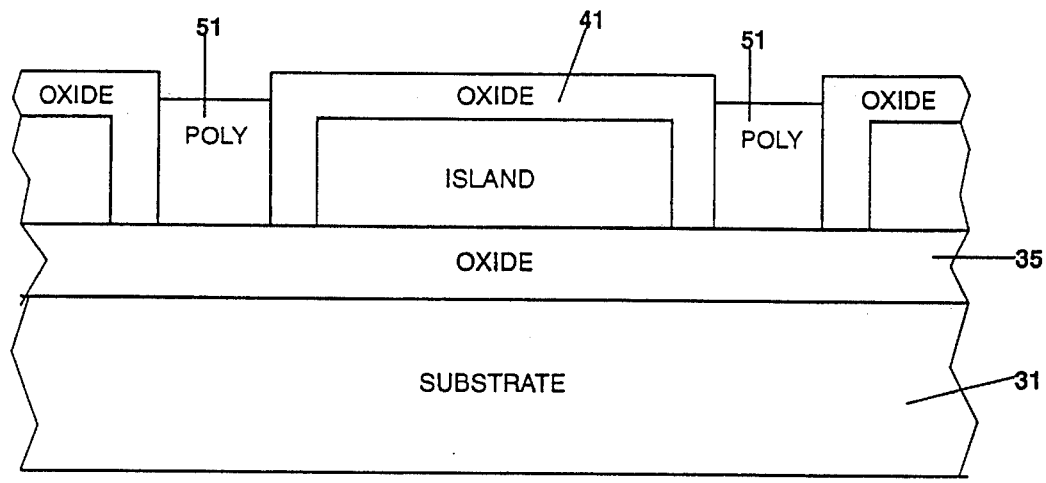

FIG. 1 shows a diagrammatic plan view of a first embodiment of the present invention as comprising a semiconductor substrate (e.g. silicon wafer) 10, which is subdivided by a pattern of isolation trenches 12, 13 and 14 into a plurality of spaced-apart semiconductor islands 21, 22, 23 and 24, such that respective ones of the spaced-apart semiconductor islands 21, 22, 23 and 24 are surrounded laterally by respective isolation trenches of the trench pattern. For purposes of the present description, the substrate 10 may comprise a silicon-on-insulator architecture, diagrammatically shown in FIG. 2 as containing an underlying support substrate 31, on a top surface 33 of which a layer of oxide 35 is formed. The depth of the trench pattern typically extends to an underlying insulator (oxide) layer 35, and the trench is coated with dielectric material, thereby effectively dielectrically isolating the respective islands from one another. A dielectric (e.g. silicon oxide) layer 41 is nonselectively formed on the trench grid network, so that the sidewalls 43 and top surfaces 45 of the islands are dielectrically isolated from each other. The remainder of the trenches 12, 13 and 14 may be filled with a layer of polysilicon 51, for example by non-selective deposition of polysilicon and planarization down to the top surface 47 of oxide layer 41, as diagrammatically illustrated in FIGS. 3, 4 and 5.

In order to provide a resistor element in an island, one or more additional trench 'strips' are formed in one or more of the islands, as shown diagrammatically at 61 in island 21, and 62 in island 22. In addition, one or more additional trench strips may be formed in the substrate 10 proper, as shown at 63 in FIG. 1.

Figure 6:
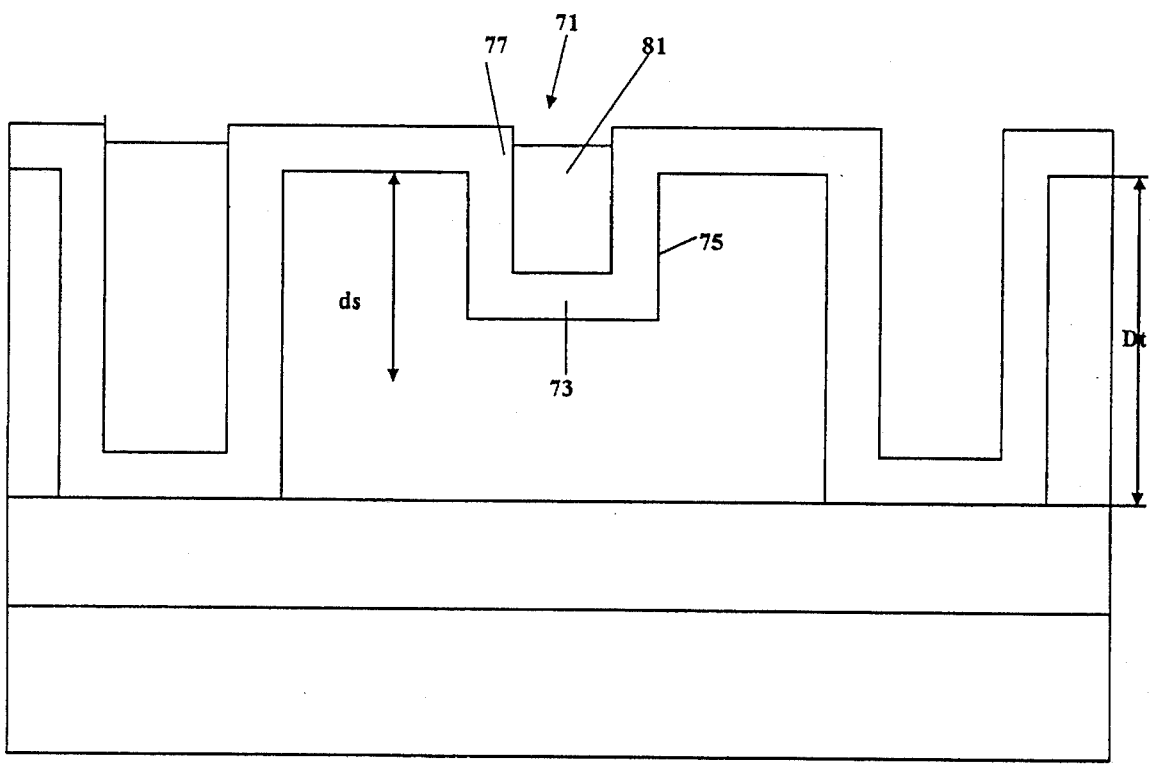
FIG. 6 shows a respective trench strip of a depth less than the depth of the trench pattern which subdivides the substrate into its respective islands.

While a respective trench strip may typically have the same depth ds as the depth Dt of the trench pattern, FIG. 6 diagrammatically illustrates the case where a respective trench strip 71 has a depth ds less than the depth Dt of the trench pattern down to the underlying substrate, which subdivides the substrate into its respective dielectrically isolated islands. As with the isolation trench pattern, a respective trench strip 71 has its bottom or floor portion 73, as well as its sidewalls 75, coated with dielectric material (oxide) 77. The remaining portion of the trench strip is filled with resistive material, such as lightly doped polysilicon 81.

Figure 7:
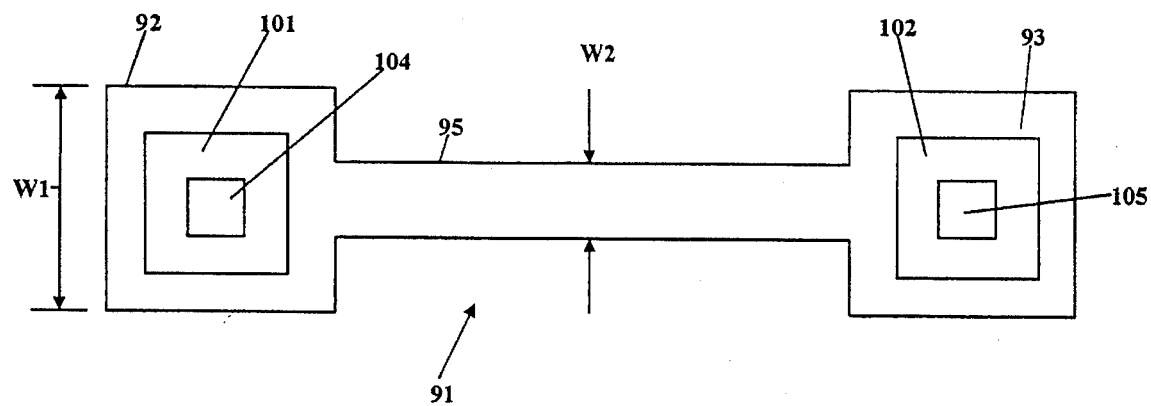
FIG. 7 shows the geometry of a trench strip resistor having first and second spaced-apart resistor contact end portions connected by a reduced width resistive trench strip portion narrower than the contact end portions.

The geometry of a trench strip resistor is preferably as shown in FIG. 7, wherein a trench strip 91 has first and second spaced-apart resistor contact end portions 92 and 93, respectively, each of which has a first width W1. These two spaced-apart resistor contact end portions 92 and 93 are connected by a reduced width (W2) resistive trench strip portion 95, narrower (W2<W1) than the contact end portions 92, 93. The width W2 or 'narrowness' of the reduced width trench strip portion 95 controls how large a resistor value is provided by the trench strip resistor. Also shown in FIG. 7 are contact diffusion regions 101 and 102 and resistor contacts 104 and 105.

To control the resistivity of the polysilicon of the trench strip regions, the polysilicon material in a respective trench strip may be lightly doped by open tube deposition of a conductivity-defining impurity (e.g. phosphorous) though the exposed top surface of the polysilicon fill, employing the overlying oxide layer 41 as a mask, so that the dopant is introduced only into the polysilicon fill of the trench strips and not into the islands. (For attaining high resistivity resistor strips, the introduction of dopant impurities by ion implantation is preferred.)

The polysilicon in each trench strip is doped in the same step, with the resistance of each poly-filled trench strip being defined by the geometry of the strip. By lightly doped, or 'resistive' is meant a resistance on the order of at least 50 ohms per square, and may be greater than 1,000 ohms per square. On the other hand, to make the polysilicon fill 'conductive' a resistance value on the order of one ohm per square or less, as in the case of the conductive cross-unders described in my above-referenced patents, is required.

Where different trench strip resistors are to have differing resistor values, different geometries for the trench strip apertures in the etch mask may be employed. In addition to the fact that the widths and lengths of the trench strips may differ from one another to set the resistor value, the combination of etch duration and trench strip width may be employed to realize trench strips of respectively different widths and depths, so that dual control of cross-sectional area (and therefore resistance) of the trench strips may be obtained.

Figure 8:
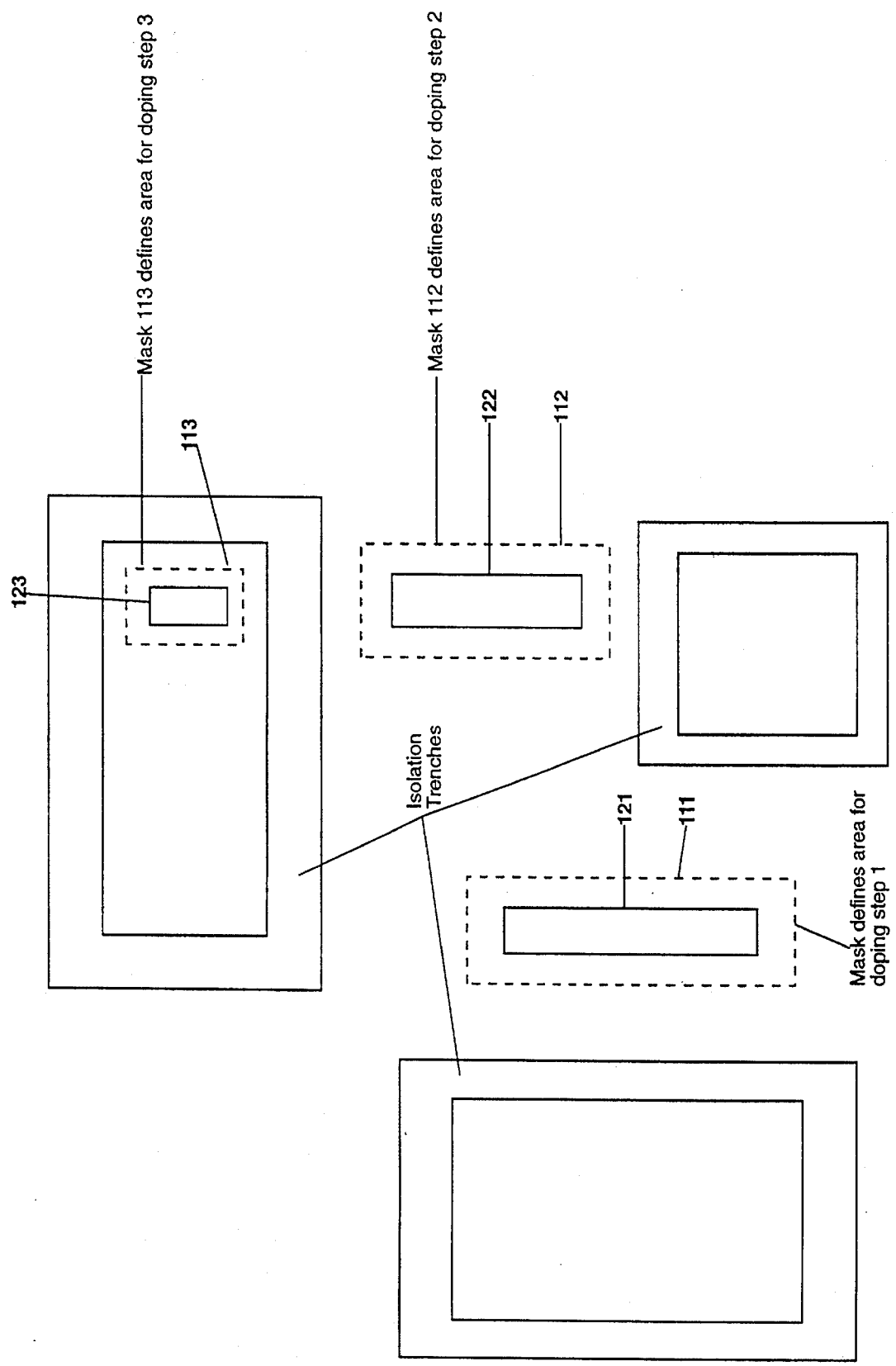
FIG. 8 diagrammatically illustrates the use of a separate set of trench mask implant steps for implanting respectively different impurity introduction dosages in different trench strip portions.

In addition to the use of geometry constraints to control the resistivity of the trench strip regions, a separate set of trench mask implant steps may be employed, as diagrammatically illustrated in FIG. 8, wherein a respectively different impurity introduction dosage is associated with each mask step. Thus, as shown in FIG. 8, a first mask has a first trench strip aperture 111 to define the location of a first resistor trench strip 121, which is to have a first resistor value. Similarly, a second mask is provided with a second trench strip aperture 112 to define the location of a second resistor trench strip 122, which is to have a second resistor value, different from that of first resistor trench strip 121. Also shown in FIG. 8 is a third mask having a third trench strip aperture 113 to define the location of a third resistor trench strip 123, which is to have a third resistor value, different from that of the first and second resistor trench strips 121 and 122.

Figure 9:
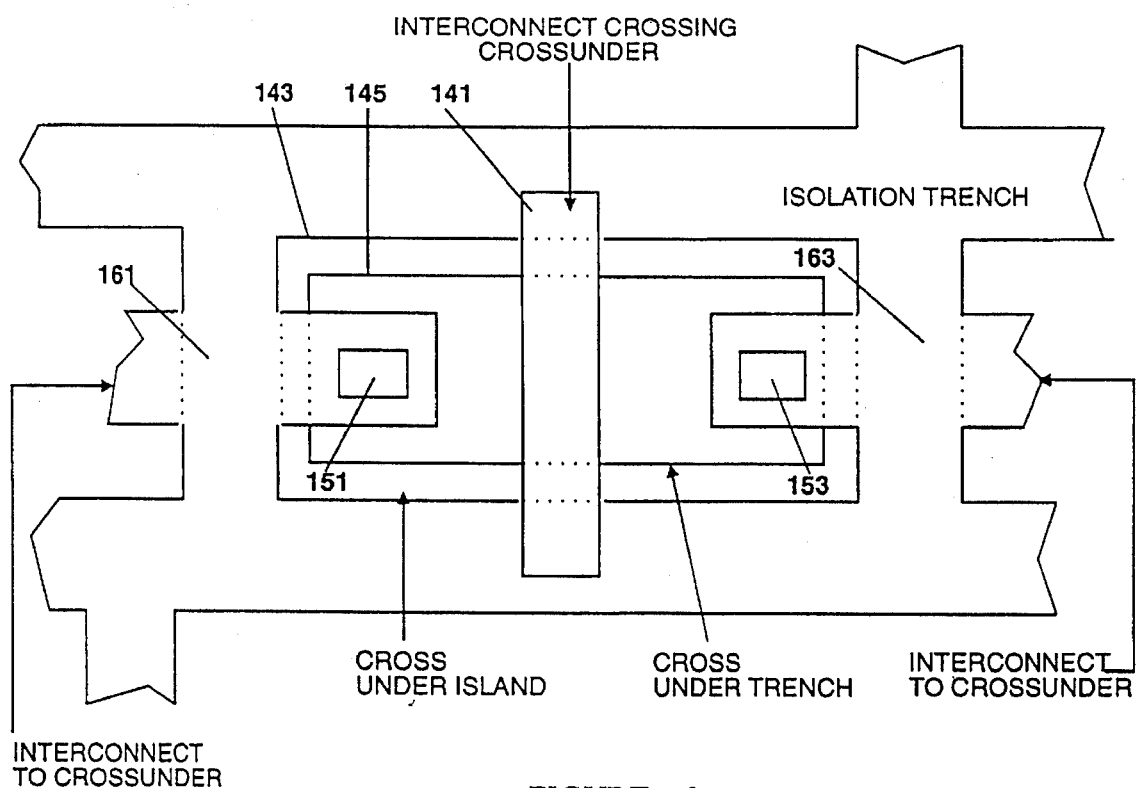
FIG. 9 effectively corresponds to FIG. 8 of my above-mentioned '373 Patent diagrammatically illustrating the case of a conductor overlying the surface of a dielectrically isolated island that contains an auxiliary poly-filled conductive trench region passing beneath conductor.

It will be appreciated that using such a multiple mask set not only allows different values resistors to be selectively formed, but allows trench strips to be formed where conductive cross-unders are to be provided in the same circuit die, as diagrammatically illustrated in FIG. 9. In this latter case a separate cross-under mask is employed to locate the cross-under trenches and the doping parameters are increased to the level necessary to make the fill material in the cross-under trenches conductive rather than resistive, as explained above. FIG. 9 effectively corresponds to FIG. 8 of my above-identified '373 Patent and shows the case of a surface conductor 141 overlying the surface of a dielectrically isolated island 143 that contains an auxiliary poly-filled trench region 145 passing beneath conductor 141. Ohmic contact apertures extend through a topside oxide layer to respective spaced-apart locations 151, 153 in trench region 145, so that a crossunder is provided by way of island 143 beneath surface conductor 141, thereby permitting a pair of surface tracks 161, 163 to be interconnected through island 143.

Figure 10:
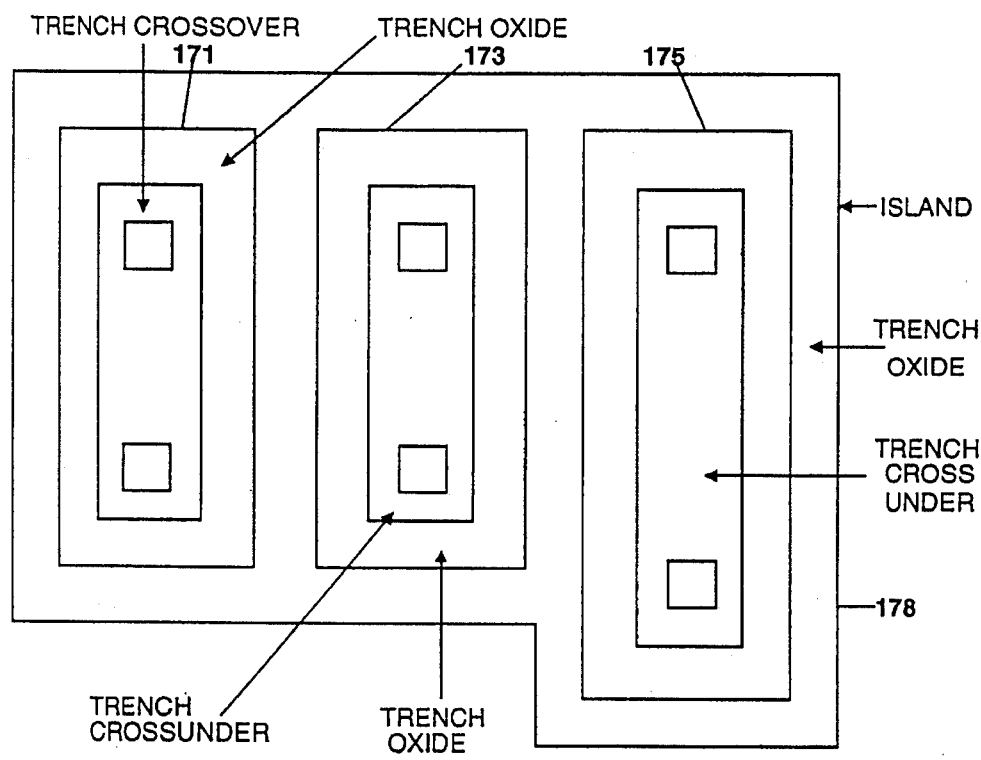
FIG. 10, which effectively corresponds to FIG. 9 of my above-identified '373 Patent, shows a plurality of poly-filled trench regions in a dielectrically isolated island.

In addition, although the auxiliary trench region-containing island 143 of FIG. 9 contains only a single poly-filled trench 145, more than one such trench region may be formed in an island as diagrammatically illustrated in FIG. 10, which corresponds to FIG. 9 of my above-identified '373 Patent and shows a plurality of poly-filled trench regions 171, 173 and 175 in dielectrically isolated island 178.

As will be appreciated from the foregoing description, pursuant to the present invention, I have extended the use of dielectrically isolated trench fill material to the formation of one or more isolated resistor elements within respective ones of a plurality of dielectrically isolated island components in which circuit devices are formed, or in the substrate proper. A respective island may have a plurality of trench strip resistor devices, which may have the same or differing resistor values depending upon their doping concentrations or geometries, particularly depth, length and width. In addition, as in my above-referenced patents, the resistor-containing architecture according to the present invention may include one or more conductive cross-unders each defined by a respective cross-under trench strip. The cross-under trench strip contains conductive material, such as heavily doped polysilicon, as opposed to lightly doped polysilicon of the resistor fill material.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising a semiconductor substrate subdivided by a trench pattern into a plurality of spaced-apart semiconductor islands, such that respective ones of said spaced-apart semiconductor islands are surrounded laterally by respective continuous trenches of said trench pattern, said respective continuous trenches of said trench pattern having bottom and sidewalls thereof coated with dielectric material, whereby said spaced-apart semiconductor islands are dielectrically isolated from one another, and wherein at least one island of said spaced-apart semiconductor islands or a portion of said substrate other than said islands has a resistor device defined by a resistor trench strip formed therein, said resistor trench strip containing bottom and sidewalls thereof coated with dielectric material, and wherein said respective continuous trenches of said trench pattern and said resistor trench strip have the same trench fill material formed on said dielectric material, and further including spaced-apart resistor contacts ohmically contacting the trench fill material of said resistor trench strip.

2. A semiconductor device according to claim 1, wherein at least one of said spaced-apart semiconductor islands has a resistor device defined by said resistor trench strip formed therein, said resistor trench strip containing resistive trench fill spaced-apart resistor contacts ohmically contacting the resistive material of said trench strip.

3. A semiconductor device according to claim 1, wherein said portion of said substrate other than said islands has a resistor device defined by said resistor trench strip formed therein, said resistor trench strip containing resistive trench fill spaced-apart resistor contacts ohmically contacting the resistive material of said trench strip.

4. A semiconductor device according to claim 1, wherein said resistor trench strip comprises first and second spaced-apart resistor contact end portions each of which has a first width, said first and second spaced-apart resistor contact end portions being connected by a resistive trench strip portion, said resistor trench strip portion containing trench fill material and having a width less than the width of said first and second spaced-apart resistor contact end portions.

5. A semiconductor device according to claim 1, wherein said resistor trench strip has a depth less than the depth of said trench pattern.

6. A semiconductor device according to claim 1, wherein said resistor trench strip has a depth less than the depth of said trench pattern and a width less than the width of said trenches.

7. A semiconductor device according to claim 1, wherein said semiconductor substrate comprises silicon and said trench fill material comprises doped polysilicon.

8. A semiconductor device according to claim 1, wherein at least one of said spaced-apart semiconductor islands has a plurality of resistor devices each of which is defined by a respective resistor trench strip having a resistor trench strip structure corresponding to that of said resistor trench strip and spaced-apart resistor contacts ohmically contacting the trench fill material of said respective trench strip.

9. A semiconductor device according to claim 1, wherein respective ones of said spaced-apart semiconductor islands have different ones of said resistor devices of respectively different resistor values.

10. A semiconductor device according to claim 1, wherein respective ones of said spaced-apart semiconductor islands have resistor trench strips of respectively different depths.

11. A semiconductor device according to claim 10, wherein said respective ones of said spaced-apart semiconductor islands have resistor trench strips of respectively different depths, less than the depth of said trench pattern.

12. A semiconductor device according to claim 1, wherein said portion of said substrate other than said spaced-apart semiconductor islands has a plurality of resistor devices each of which is defined by a respective resistor trench strip having a resistor trench strip structure corresponding to that of said resistor trench strip and spaced-apart resistor contacts ohmically contacting the trench fill material of said respective trench strip.

13. A semiconductor device according to claim 1, wherein said portion of said substrate other than said spaced-apart semiconductor islands has different ones of said resistor devices of respectively different resistor values.

14. A semiconductor device according to claim 1, wherein said portion of said substrate other than said spaced-apart semiconductor islands has resistor trench strips of respectively different depths.

15. A semiconductor device according to claim 14, wherein said portion of said substrate other than said spaced-apart semiconductor islands has resistor trench strips of respectively different depths, less than the depth of said trench pattern.

16. A semiconductor device according to claim 1, wherein said semiconductor substrate further includes at least one additional resistor device defined by at least one additional resistor trench strip disposed in a portion of said substrate apart from said plurality of spaced-apart semiconductor islands, said at least one additional resistor trench strip having a resistor trench strip structure corresponding to that of said resistor trench strip and spaced-apart contacts contacting the trench fill material therein.

17. A semiconductor device according to claim 16, wherein said at least one additional resistor trench strip comprises a plurality of additional resistor trench strips.

18. A semiconductor device according to claim 17, wherein said plurality of additional resistor trench strips includes additional resistor trench strips of respectively different depths.

19. A semiconductor device according to claim 16, wherein said at least one additional resistor trench strip has a depth less than the depth of said trench pattern.

20. A semiconductor device according to claim 1, wherein at least one of said space-apart semiconductor islands has circuit device regions formed in a first portion thereof and trench strip formed in a second portion thereof.

21. A semiconductor device according to claim 1, wherein a respective one of said spaced-apart semiconductor islands further includes a conductive cross-under defined by a further cross-under trench strip formed therein, said further cross-under trench strip containing conductive material and spaced-apart cross-under contacts ohmically contacting the conductive material of said further cross-under trench strip, the resistivity of said conductive material being less than the resistivity of said trench fill material.

22. A semiconductor device according to claim 21, wherein said further cross-under trench strip has bottom and sidewalls thereof coated with dielectric material, and wherein said trench pattern is filled with semiconductor material, and each of said resistor trench strip and said further cross-under trench strip is filled with doped semiconductor material, and wherein doped semiconductor material formed in said resistor trench strip is more lightly doped than doped semiconductor material formed in said further cross-under trench strip.

23. A semiconductor device according to claim 1, wherein a respective resistor trench strip contains only a single layer of the same trench fill material throughout.

24. A semiconductor device comprising a semiconductor substrate subdivided by a trench pattern into a plurality of spaced-apart semiconductor islands, such that respective ones of said spaced-apart semiconductor islands are surrounded laterally by respective continuous trenches of said trench pattern, said respective continuous trenches of said trench pattern having bottom and sidewalls thereof coated with dielectric material, whereby said spaced-apart semiconductor islands are dielectrically isolated from one another, and wherein at least one island of said spaced-apart semiconductor islands and a portion of said substrate other than said islands has a respective resistor device defined by a respective resistor trench strip formed therein, said respective resistor trench strip containing bottom and sidewalls thereof coated with dielectric material, and wherein said respective continuous trenches of said trench pattern and said respective resistor trench strip contain the same trench fill material formed on said dielectric material, and further including spaced-apart resistor contacts ohmically contacting the trench fill material of said respective resistor trench strip.

\* \* \* \* \*